(12) United States Patent
Terada et al.

(10) Patent No.: US 7,800,461 B2
(45) Date of Patent: Sep. 21, 2010

(54) ANTENNA BRANCHING FILTER

(75) Inventors: Satoshi Terada, Saitama (JP);
Toshikazu Hirocho, Saitama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 156 days.

(21) Appl. No.: 12/145,809

(22) Filed: Jun. 25, 2008

(65) Prior Publication Data
US 2009/0002095 A1    Jan. 1, 2009

(30) Foreign Application Priority Data
Jun. 29, 2007    (JP) .............................. 2007-173002

(51) Int. Cl.
*H03H 7/18* (2006.01)
*H03H 7/01* (2006.01)
*H03H 9/64* (2006.01)

(52) U.S. Cl. .................. 333/175; 333/133; 333/193

(58) Field of Classification Search ................. 333/133, 333/193, 194, 195, 196, 186, 187, 188, 189, 333/190, 191, 192, 150, 151, 175
See application file for complete search history.

(56) References Cited

U.S. PATENT DOCUMENTS 6,489,861 B2 * 12/2002 Noguchi et al. ............. 333/133
7,057,472 B2 * 6/2006 Fukamachi et al. ......... 333/101
7,498,899 B2 * 3/2009 Iwaki et al. ................. 333/133
2001/0052830 A1   12/2001 Noguchi et al.
2004/0227585 A1   11/2004 Taniguchi et al.

FOREIGN PATENT DOCUMENTS

EP    1418680    5/2004
EP    1641119    3/2006

OTHER PUBLICATIONS

European Search Report dated Feb. 18, 2010.

* cited by examiner

*Primary Examiner*—Dean O Takaoka
(74) *Attorney, Agent, or Firm*—Andrus, Sceales, Starke & Sawall, LLP

(57) ABSTRACT

In an antenna duplexer including a high band side filter, a low band side filter, and a phase shifter in a low pass configuration inserted between the high band side filter and an antenna port and taking phase matching of both filters, a resonance inductor resonating with a capacitor on the antenna port side is provided to obtain a attenuation characteristic in an optional band in an out-of-pass band of both filters by the resonance. For instance, the maximum attenuation is held at twice of the center frequency $f_L$ of a pass band of the low band side filter. The LC resonance circuit configuration can be desirably modified into a configuration such that a resonance capacitor is provided to an inductor in a phase shifter having a high band side filter configuration.

5 Claims, 14 Drawing Sheets

(a) FREQUENCY CHARACTERISTICS OF PHASE SHIFTER + HIGH PASS FILTER (b) IMPEDANCE CHARACTERISTICS OF PHASE SHIFTER + HIGH-PASS FILTER (a) FREQUENCY CHARACTERISTICS OF PHASE SHIFTER + HIGH PASS FILTER (b) IMPEDANCE CHARACTERISTICS OF PHASE SHIFTER + HIGH-PASS FILTER

FIG. 4
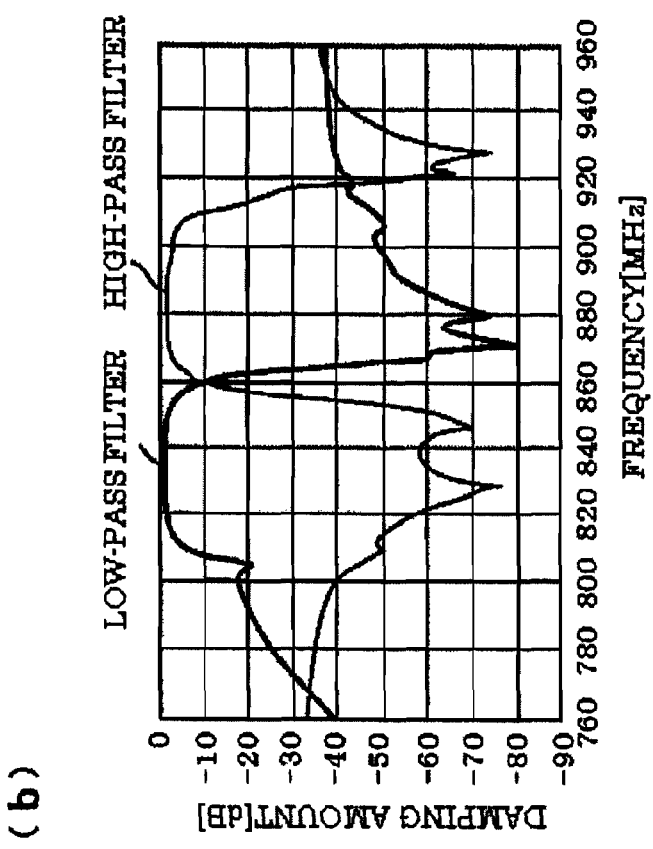
(a)
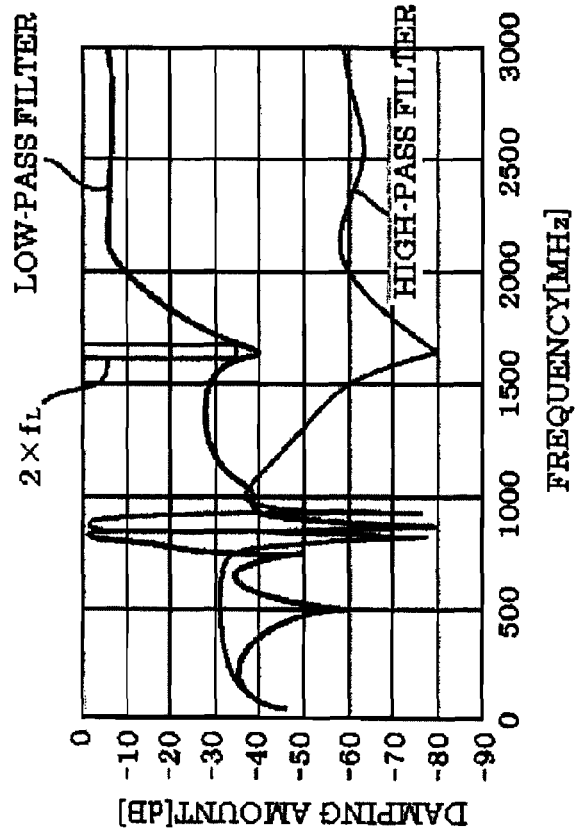
(b)

FIG. 6
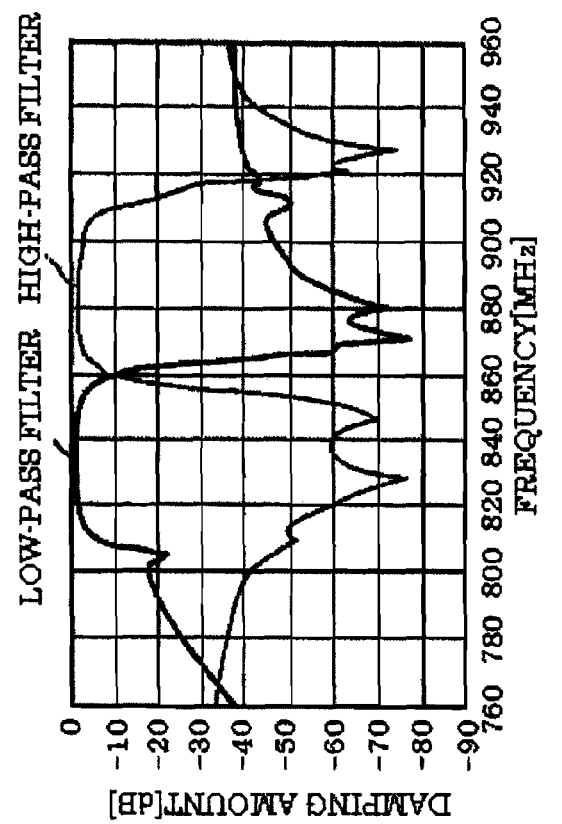
(a)
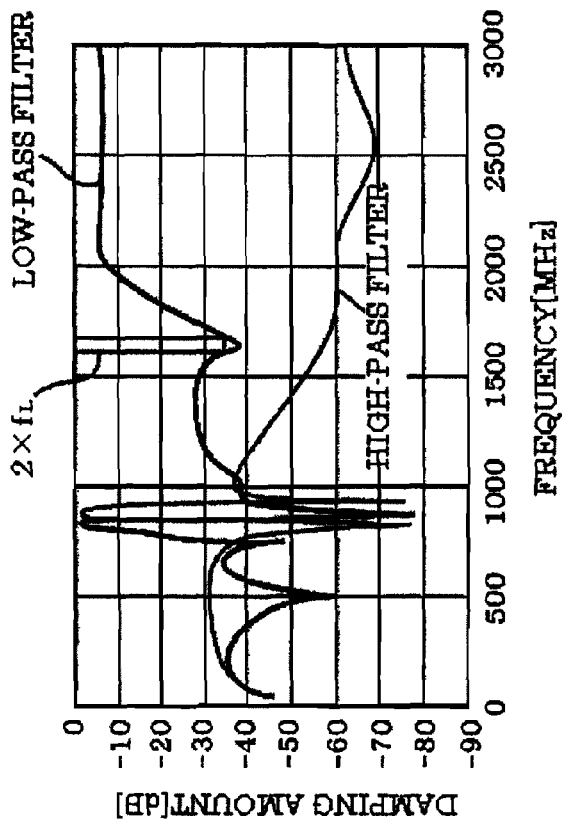
(b)

FIG. 8
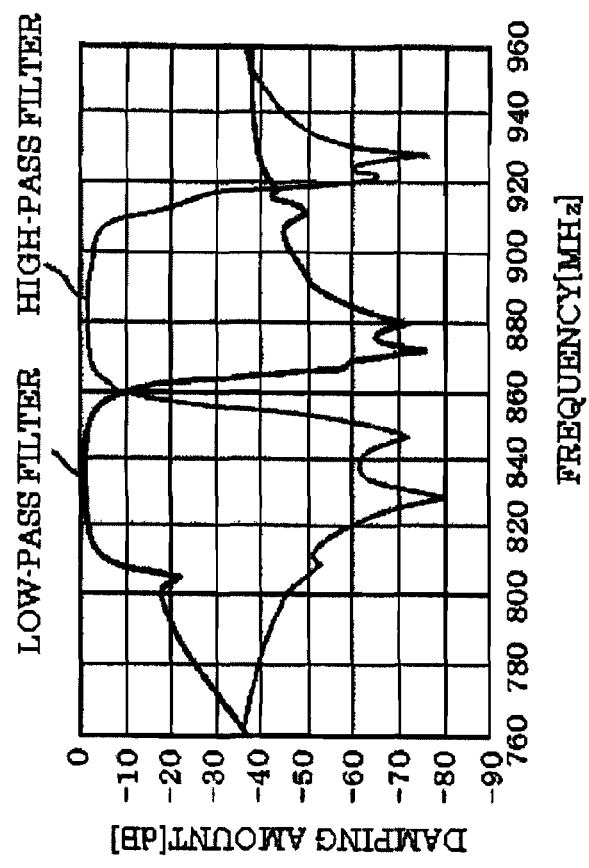
(a)
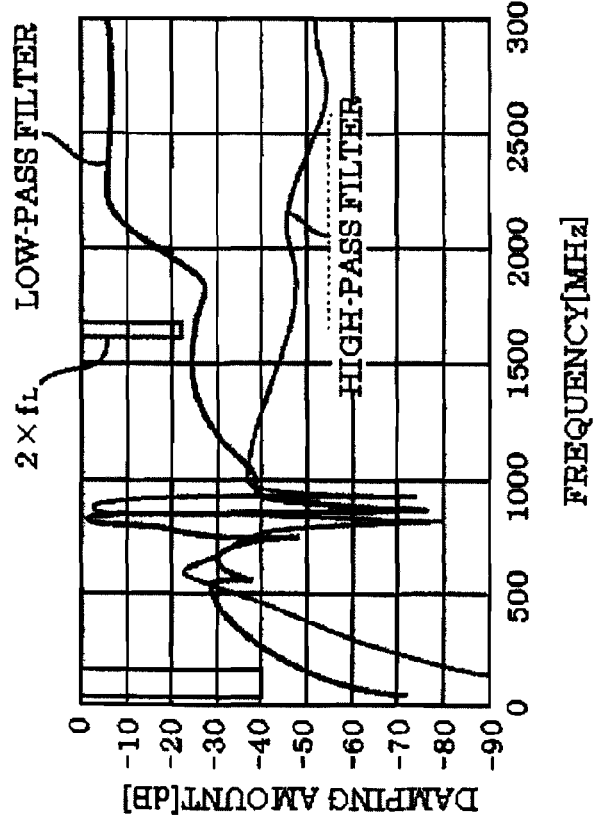
(b)

FIG. 14
PRIOR ART
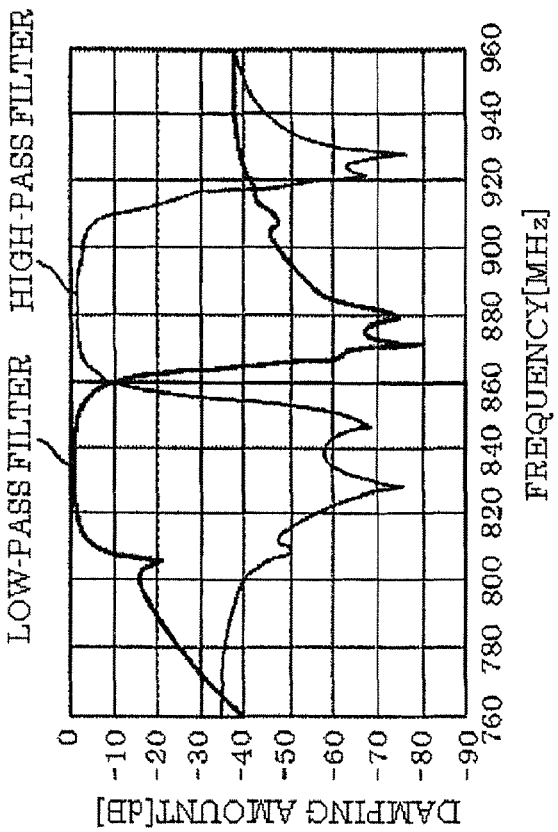
(a)
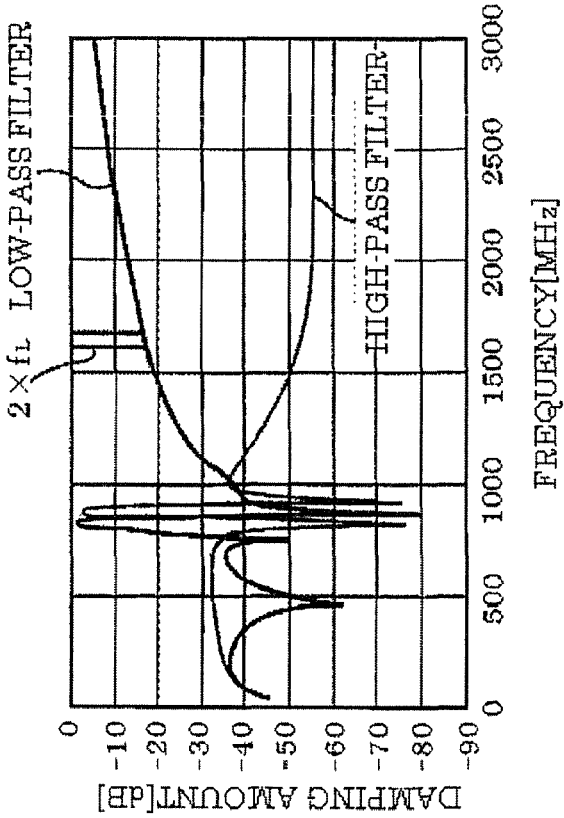
(b)

ANTENNA BRANCHING FILTER

BACKGROUND OF THE INVENTION

1. Field of the Invention

The present invention relates to an antenna duplexer in which two filters of a high band side filter and a low band side filter are connected to an antenna port, and in particular relates to a phase shifter reducing interference between both filters.

2. Description of the Related Art

This kind of antenna duplexer is used as a duplexing means for transmitting and receiving waves in a high frequency wireless communication device such as a mobile communication terminal such as a cellular phone, a PHS, or a wireless LAN, or the like. A SAW (surface acoustic wave) filter is used for a high band side filter and a low band side filter. One of the high band side filter and the low band side filter is allocated to a transmitting side and the other is allocated to a receiving side, and both filters pass through only high frequency signals each having a specific frequency band and block signals of other frequency bands. When a plurality of SAW filters different in pass band are directly connected to the antenna in the antenna duplexer, respective transmitting and receiving signals interfere, so that provision of a phase shifter (phase matching circuit) is required.

FIG. 13 shows a conventional circuit structure of the antenna duplexer which includes a phase shifter. In the drawing, an antenna duplexer for an 800 MHz band US-CDMA is shown as an example. In general, these three of an antenna port, a high band side filter, and a low band side filter are required for an electric port. Each one system of "The high band side filter" and "the low band side filter" are installed inside the duplexer. In addition, the phase shifter is installed on the antenna port side of the high band side filter, and these are connected to point "A" just below the antenna port.

Specifically, a high band side filter 11 and a low band side filter 12 both include a plurality of SAW resonators 10 connecting in a ladder-shape, the high band side filter 11 takes the first stair on the antenna 13 side (the point A side) as a T-type input, and the low frequency filter 12 takes the first stage on the antenna 13 side as a π type input. A phase shifter 14 is inserted between the high band side filter and the antenna 13.

The phase shifter 14 is formed with an inductor and a capacitor in a π type. In other words, it forms a low band side filter configuration composed of an inductor 15 connected in series between the input/output terminal of the high band side filter 11 and the antenna 13, a capacitor 16 connected between the input/output terminal and the ground, and a capacitor 17 connected between the antenna 13 and the ground.

As these inductor 15, capacitors 16 and 17, a λ/4 microstrip line, lumped-constant circuits or the like are used (for instance, refer to Patent Document 1). In addition, a phase shifter in a high pass structure is known, in which a capacitor is disposed in series between an input/output signal of the high band side filter 11 and an antenna, and an inductor is disposed in parallel between both terminals of the capacitor and the ground (refer to Patent Document 2 for instance).

[Patent Document 1] Japanese Patent Application Laid-open No. 2004-228911

[Patent Document 2] Japanese Patent Application Laid-open No. 2006-129445

SUMMARY OF THE INVENTION

As described above, in the antenna duplexer using a SAW filter, a phase shifter is arranged including the SAW filter. The phase shifter 14 can match the high band side filter 11 with the low band side filter 12. However, as shown in FIG. 14A and FIG. 14B which partially enlarges FIG. 14A, there is a problem such that in the conventional frequency characteristics, the required out-of-band attenuation characteristics can not be ensured, for instance, when the center frequency in a pass band of the low band side filter is supposed to be $f_L$, the attenuation amount in the vicinity of twice frequency ($2 \times f_L$) of this center frequency cannot be guaranteed. This problem will be explained more specifically. In the antenna duplexer, amplifiers are connected to the high band side filter 11 and the low band side filter 12 respectively, and the amplifiers generate spuriousness at a frequency integral multiple of a pass band. In particular, the spuriousness of higher harmonics corresponding to the frequency twice as many as that of the pass band is high. For instance, when the low band side filter 12 is provided on the transmitting side, a signal amplified by the amplifier passes through the low band side filter 12 and outputs from the antenna 13. However, if the amount of attenuation in the vicinity of $2 \times f_L$ is small, it becomes a noise signal in other frequency bands allocated to, for instance, a portable terminal.

The object of the present invention is to provide an antenna duplexer which ensures the phase matching function of a phase shifter, and can improve the attenuation characteristic in a frequency band out of pass band of the high band side filter and the low band side filter.

In order to solve the above-described problem, the present invention provides an inductor or a capacitor composing a phase shifter, and an LC resonating resonance capacitor or an LC resonating resonance inductor so as to obtain the attenuation characteristics in an optional band in an out-of-pass band of the filters by this LC resonance, which has the following configuration.

(1) An antenna duplexer including a high band side filter, a low band side filter, an inductor, and a capacitor, and provided with a phase shifter connected to both filters on the antenna port sides to ensure phase matching of both filters, in which the phase-shifter includes a resonance capacitor resonating with the inductor, or a resonance inductor resonating with the capacitor, and the attenuation characteristic is obtained in an out-of-pass band of both filters by the resonance.

More concretely, the high band side filter and the low band side filter are configured by connecting themselves, for instance, in a ladder-shape using an elastic wave device such as a surface acoustic wave device.

(2) The phase shifter is made in a filter configuration by providing an inductor in series between the high band side filter and the antenna port and by providing capacitors respectively between both terminals of the inductor and the ground and the resonance inductor is placed to the capacitor in series on the antenna port side.

(3) The phase shifter is made in a filter configuration by providing an inductor in series between the high band side filter and the antenna port and by providing capacitors respectively between both terminals of the inductor and the ground and a common resonance inductor is placed between both of the capacitors and the ground.

(4) The phase shifter is made in a filter configuration by providing a capacitor in series between the high band side filter and the antenna port and by providing inductors respectively between both terminals of the capacitor and the ground and the resonance capacitor is placed in series to the inductor on the antenna port side.

In addition, another inventions are achieved such that a band-pass function is obtained by providing a resonance inductor which performs LC resonance with a capacitor composing the phase shifter and by setting a resonance frequency within the pass-band of the filter so that the amount of attenuation in an out-of-frequency band corresponding to the band-pass is designed to be finally improved. Concretely, it is configured as follows.

(5) An antenna duplexer including a high band side filter, a low band side filter, an inductor, and a capacitor, and provided with a phase shifter connected to both filters on the antenna port sides to ensure phase matching of both filters, in which the phase-shifter is made in a filter configuration by providing a capacitor in series between the high band side filter and the antenna port and by providing inductors respectively between both terminals of the capacitor and the ground; and a resonance inductor resonating in a pass-band of the high band side filter or the low band side filter is placed in series to the capacitor.

(6) An antenna duplexer including a high band side filter, a low band side filter, an inductor and a capacitor, and provided with a phase shifter connected to both filters on the antenna port sides to ensure phase matching of both filters, in which the phase shifter is made in a filter configuration by providing an inductor in series between the high band side filter and the antenna port and by providing capacitors respectively between both terminals of the inductor and the ground; and a resonance inductor resonating in a pass-band of the high band side filter or the low band side filter is placed in parallel to the capacitor on the antenna port side.

As described above, since the present invention (the embodiments correspond to FIG. 1, FIG. 5 and FIG. 11) provides an inductor or a capacitor composing a phase shifter, and an LC resonating resonance capacitor or an LC resonating inductor so as to obtain a attenuation characteristic in an optional band in an out-of-pass band of the filters by the LC resonance, it has the effect of ensuring the phase matching function of the phase shifter and improving the attenuation characteristics in an optional frequency band in an out-of-pass band of the high band side and the low band side filters. In addition, according to other inventions (the embodiments correspond to FIG. 7 and FIG. 9), by series resonation in a signal path in the phase-shifter, or by parallel resonation between the signal path and the ground, the band-pass function is obtained to the pass-band of the filter so that the amount of attenuation in an out-of-frequency band corresponding to the band-pass can be finally improved.

BRIEF DESCRIPTION OF THE DRAWINGS

FIGS. 4A and 4B are frequency characteristic views of the antenna duplexer according to the first embodiment;

FIGS. 6A and 6B are frequency characteristics of the antenna duplexer according to the second embodiment;

FIGS. 8A and 8B are frequency characteristics of the antenna duplexer according to the third embodiment;

FIGS. 14A and 14B are frequency characteristic views of the conventional antenna duplexer.

DETAILED DESCRIPTION OF THE PREFERRED EMBODIMENT(S)

Figure 1:
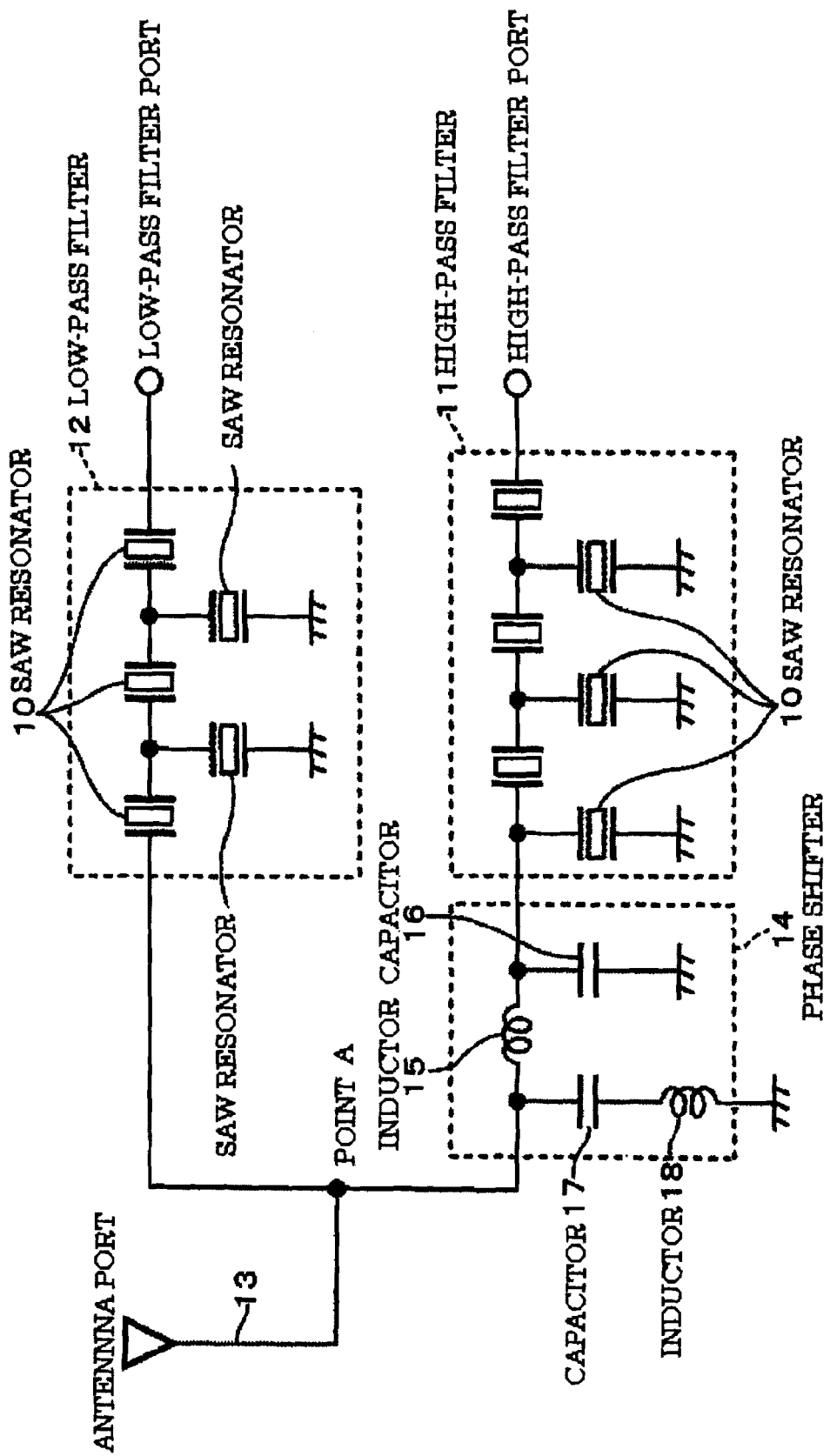
FIG. 1 is a circuit configuration view of an antenna duplexer showing a first embodiment of the present invention.
Figure 13:
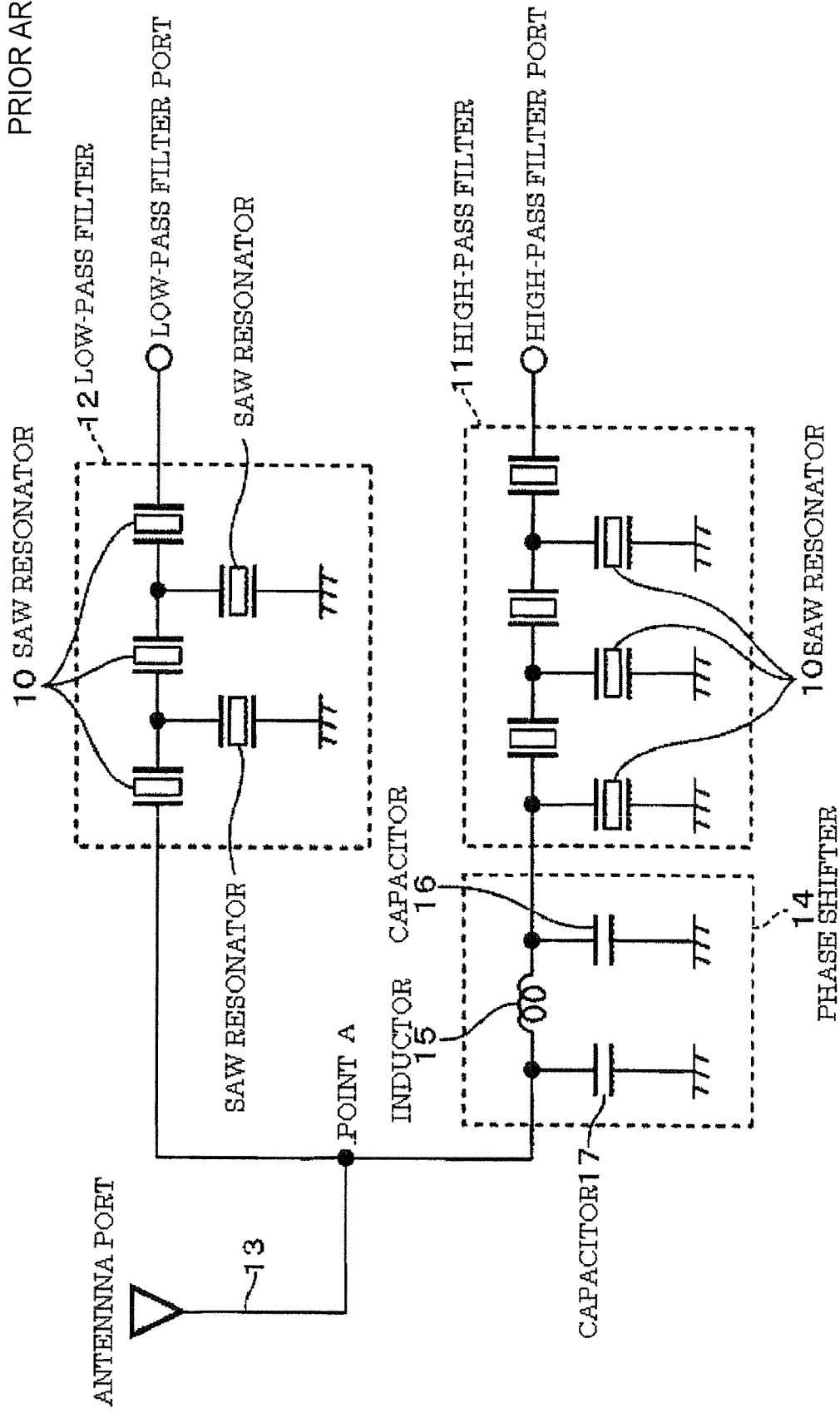
FIG. 13 is a circuit configuration view of a conventional antenna duplexer.

FIG. 1 is a circuit configuration view of an antenna duplexer showing a first embodiment of the present invention, and a point different from that in FIG. 13 is addition of an LC resonance inductor 18. This antenna duplexer includes, as shown in FIG. 1, a high band side filter 11 and a low band side filter 12 each connecting SAW resonators in a ladder shape, and a phase shifter 14 connecting an inductor 15, capacitors 16 and 17 in a π shape between the high band side filter 11 and an antenna port, and further includes the LC resonance inductor 18 added to the phase shifter 14. A high band side filter and a low band side filter are described as high-pass filter and low-pass filter for convenience respectively.

In this example, the high band side filter 11 is provided on the transmitting side and the low band side filter 12 is provided on the receiving side. The LC resonance inductor 18 is inserted in series to the capacitor 17 provided between the connection point of the input/output terminal of the phase shifter 14 with the antenna 13 and the ground to series resonance with the capacitor 17. In short, the LC resonance inductor 18 and the capacitor 17 form an LC resonance circuit.

Figure 2:
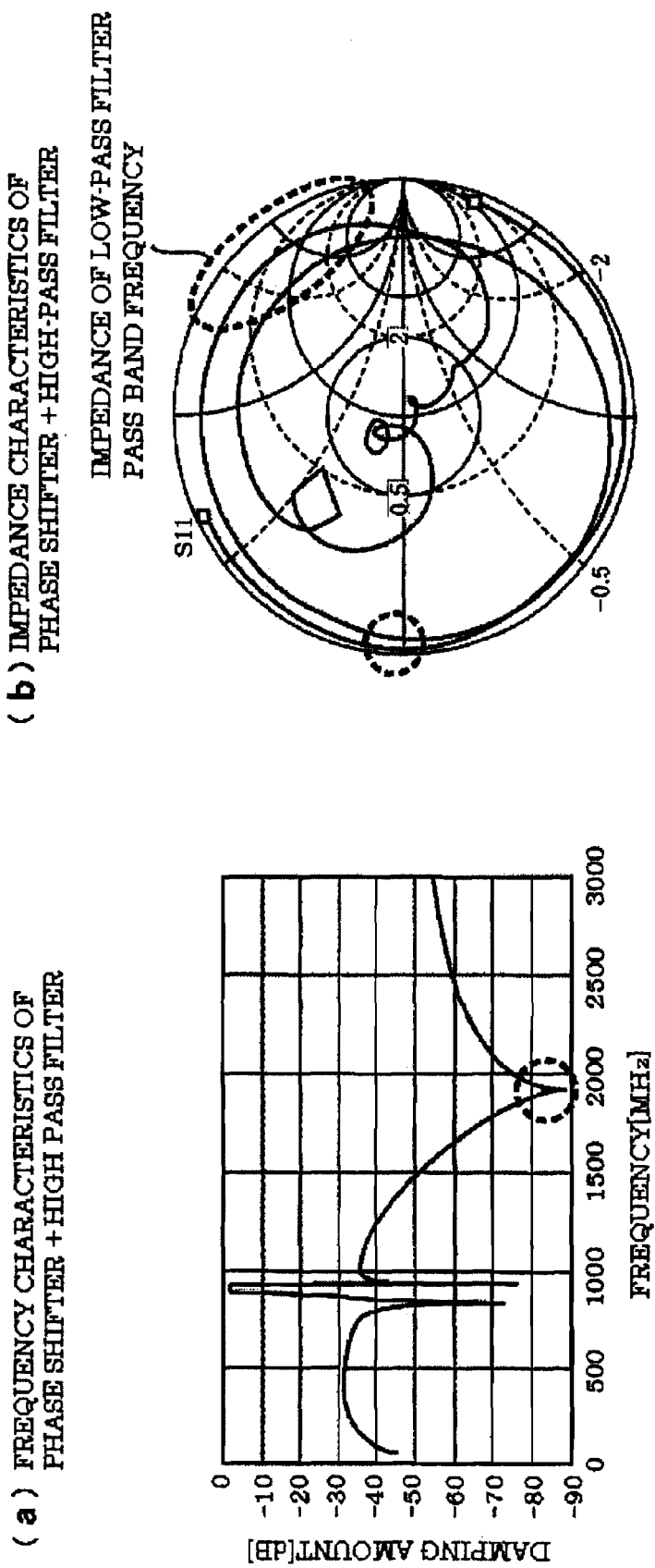
FIGS. 2A and 2B are views of a circuit configuration of a phase shifter+a high band side filter, and a frequency characteristic and an impedance characteristic in the first embodiment.

In the configuration in FIG. 1, the inductor value and the capacity of a capacitor are determined so that a series resonance frequency of the capacitor 17 and the inductor 18 devices is near the frequency which is to be dampened, for instance, in the vicinity of $2 \times f_L$. At this time, the impedance seen from the antenna terminal side to the phase shifter 14 side comes near to a SHORT at a frequency in the vicinity of $2 \times f_L$ like as the left end surrounded by a circle with the impedance characteristic shown in FIG. 2B. The frequency characteristic of the phase shifter+high band side filter shows the maximum attenuation in the vicinity of $2 \times f_L$ as shown in FIG. 2A, so that the amount of attenuation at $2 \times f_L$ can be improved. Further, as shown in FIG. 2B, the impedance at the vicinity of $f_L$ is on the infinity (OPEN) side, and the phase matching function as a phase shifter is firmly maintained.

Figure 3:
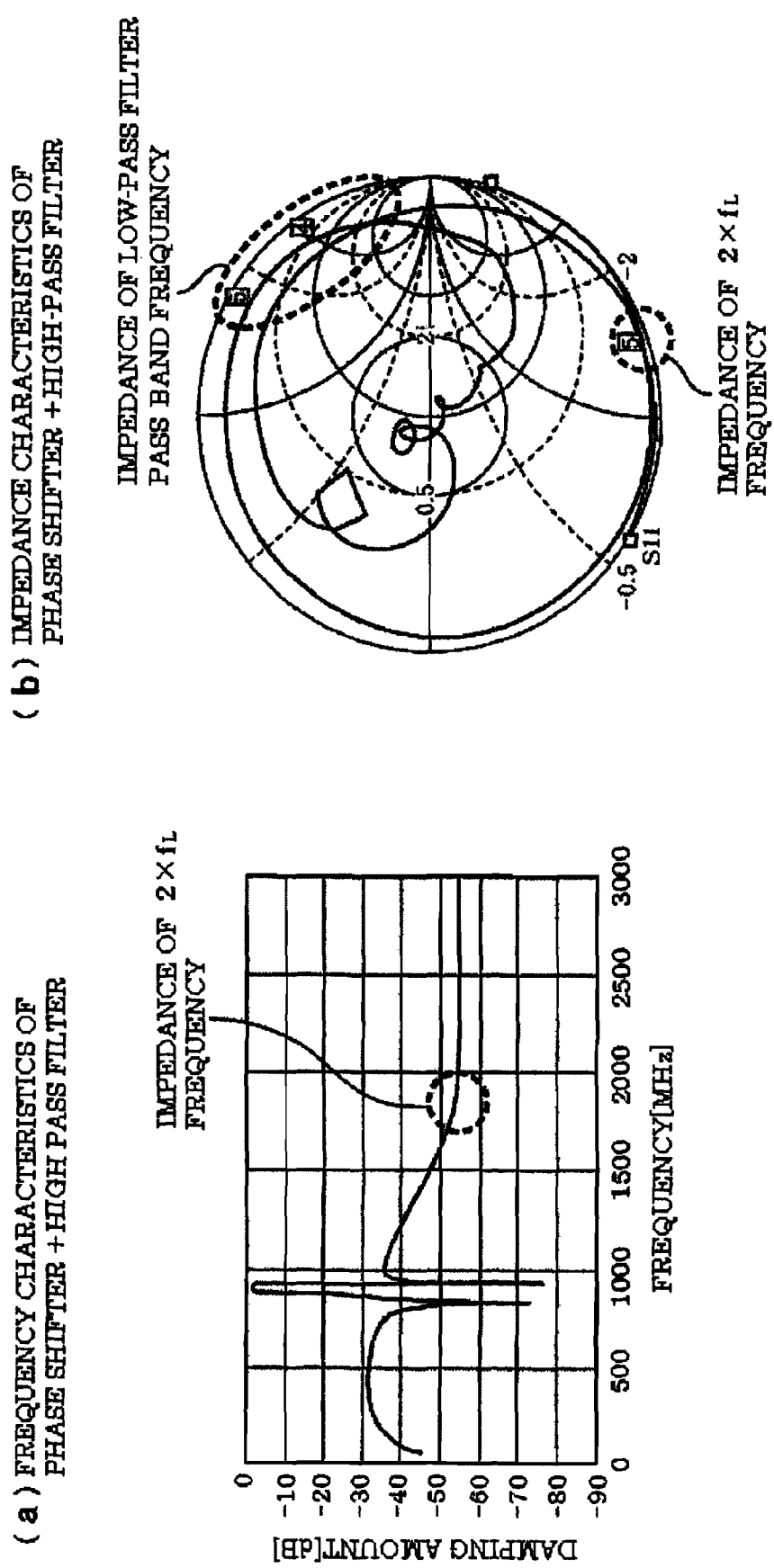
FIGS. 3A and 3B are views of a conventional frequency characteristic and a conventional impedance characteristic.

FIGS. 3A and 3B show the frequency characteristic (A) and the impedance characteristic (B) in a conventional phase shifter+high band side filter configuration. In frequencies at the vicinity of $2 \times f_L$, as surrounded by a circle at a lower part in the middle of the Smith chart, there is no impedance in the vicinity of SHORT but in the vicinity of 50Ω, and there is no maximum attenuation in the vicinity of $2 \times f_L$, when the frequency characteristic is checked. FIGS. 4A and 4B show a frequency characteristic of the antenna duplexer in a configuration shown in FIG. 1. FIG. 4B is a view enlarging a part of FIG. 4A. In the conventional configuration, as shown in FIGS. 14A and 14B, the amount of attenuation at $2 \times f_L$ of the low band side filter is about 16 dB, but in the circuit in the present embodiment, as shown in FIG. 4A, owing to the maximum attenuation in the vicinity of $2 \times f_L$ obtained by the resonance characteristic of the capacitor 17 and the inductor 18 in a phase shifter, the amount of attenuation at $2 \times f_L$ of the low band side filter is 40 dB, which is about 23 dB improvement in the amount of attenuation. In addition, there is little degradation in insertion loss of a low band side filter and a high band side filter.

Another Embodiment

The circuit configuration and the layout of the phase shifter 14 in FIG. 1 are appropriately design changed, so that the attenuation characteristic in an optional frequency band in an out-of-pass band of the high band side filter and the low band side filter can be improved. These embodiments will be explained hereinafter.

Figure 5:
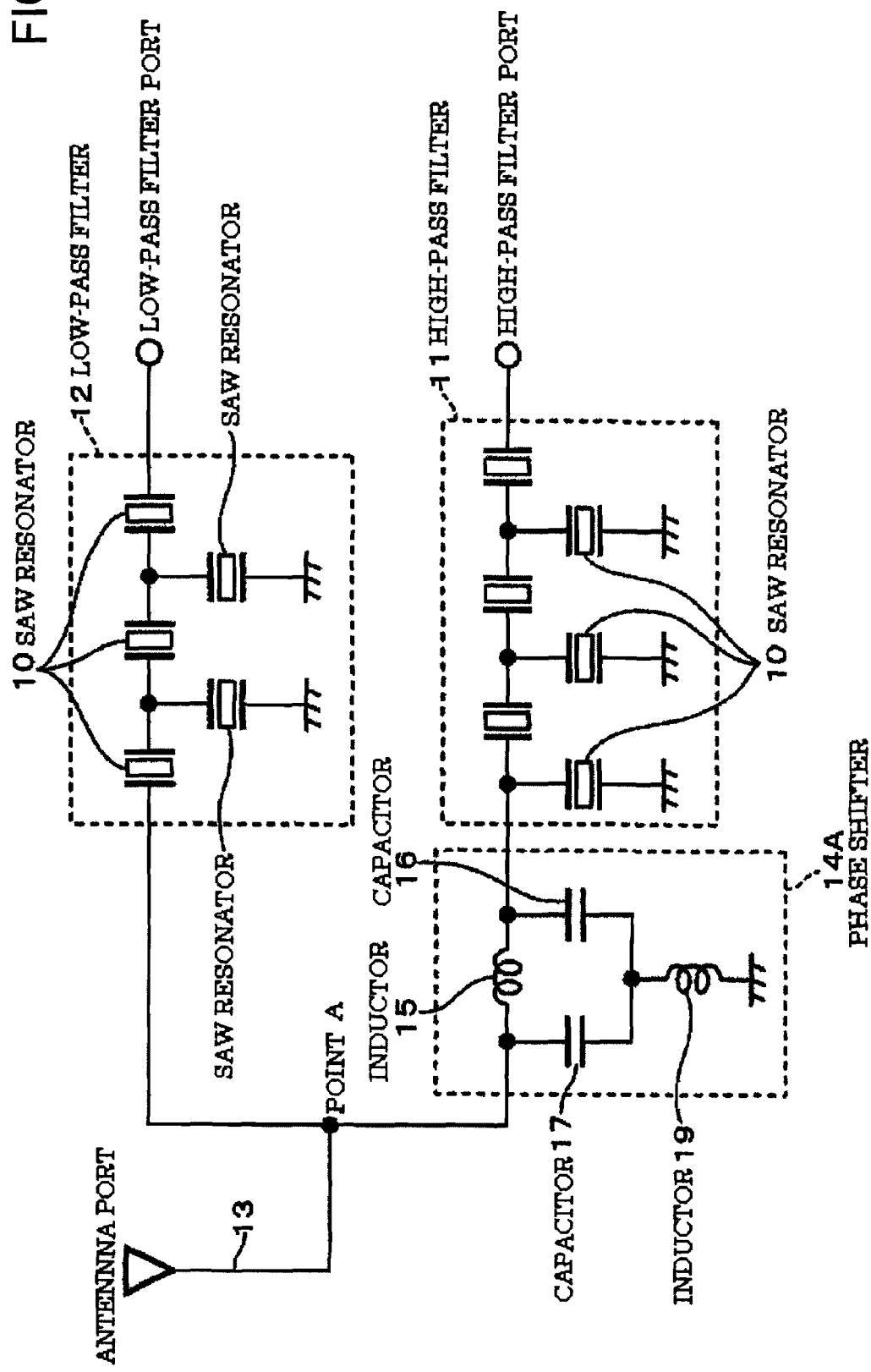
FIG. 5 is a circuit configuration view of an antenna duplexer showing a second embodiment of the present invention.

A phase shifter 14A used in the antenna duplexer shown in FIG. 5 includes an inductor 15 inserted in series between a high band side filter 11 and an antenna port 13, two pieces of capacitors 16 and 17 respectively inserted between both terminals of the inductor 15 and ground, and an LC resonance inductor 19 commonly connected in series to a parallel circuit of the capacitors 16 and 17 between these capacitors 16, 17 and the ground. The resonance inductor 19 is to resonate with the parallel circuit of the capacitors 16 and 17, and a resonance circuit is configured with the capacitors 16, 17 and the inductor 19. The inductor value of the inductor 19 and the capacity of the capacitors 16, 17 are determined so that a series resonance frequency is near the frequency to be damped, for instance, in the vicinity of $2 \times f_L$. The frequency characteristic of the antenna duplexer in the case of this phase shifter configuration is improved by 22 dB, compared with the conventional example (FIG. 14), as shown in FIG. 6A and FIG. 6B which partially enlarges FIG. 6A, because the attenuation amount at $2 \times f_L$ of the low band side filter is 38 dB.

Figure 7:
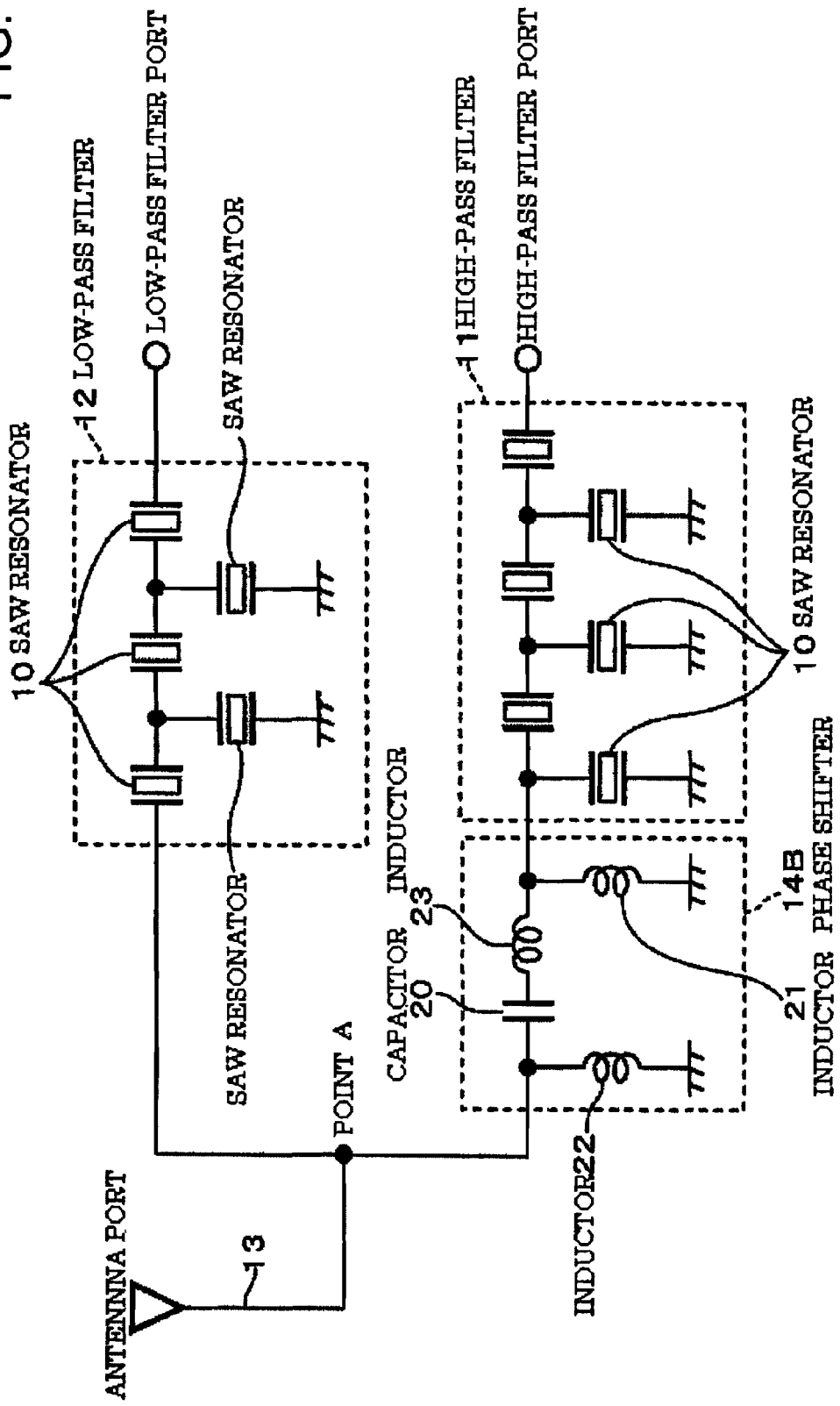
FIG. 7 is a circuit configuration view of an antenna duplexer showing a third embodiment of the present invention.

A phase shifter 14B used in the antenna duplexer shown in FIG. 7 is configured as a high pass filter disposing a capacitor 20 in series between an an antenna port 13 of a high band side filter 11 and an antenna, and disposing inductors 21 and 22 in parallel between both terminals of the capacitor 20 and the ground. The series resonance circuit is configured by connecting an LC resonance inductor 23 in series to the capacitor 20 so as to perform series resonance within the pass-band of the high band side filter 11 or the low band side filter 12. In this example, it is designed to perform series resonance in the vicinity of $f_L$. The frequency characteristic in this phase shifter is improved by 9 dB, compared with the conventional example (FIG. 14), because the amount of attenuation at $2 \times f_L$ of the low band side filter is 25 dB, as shown in FIG. 8A and in FIG. 8B which partially enlarges FIG. 8A. In addition, the amount of attenuation of the low band side filter and the high band side filter in the frequencies at 100 MHz or below are drastically improved compared with the conventional example. Accordingly, it is superior to the conventional one as a band-pass filter. The reason of obtaining such an operation like this is considered to be due to appearance of the function of the band-pass filter by the series resonance in addition to the function of the phase shifter, which results in improvement in the amount of attenuation in an out-of-pass band as a result.

Figure 9:
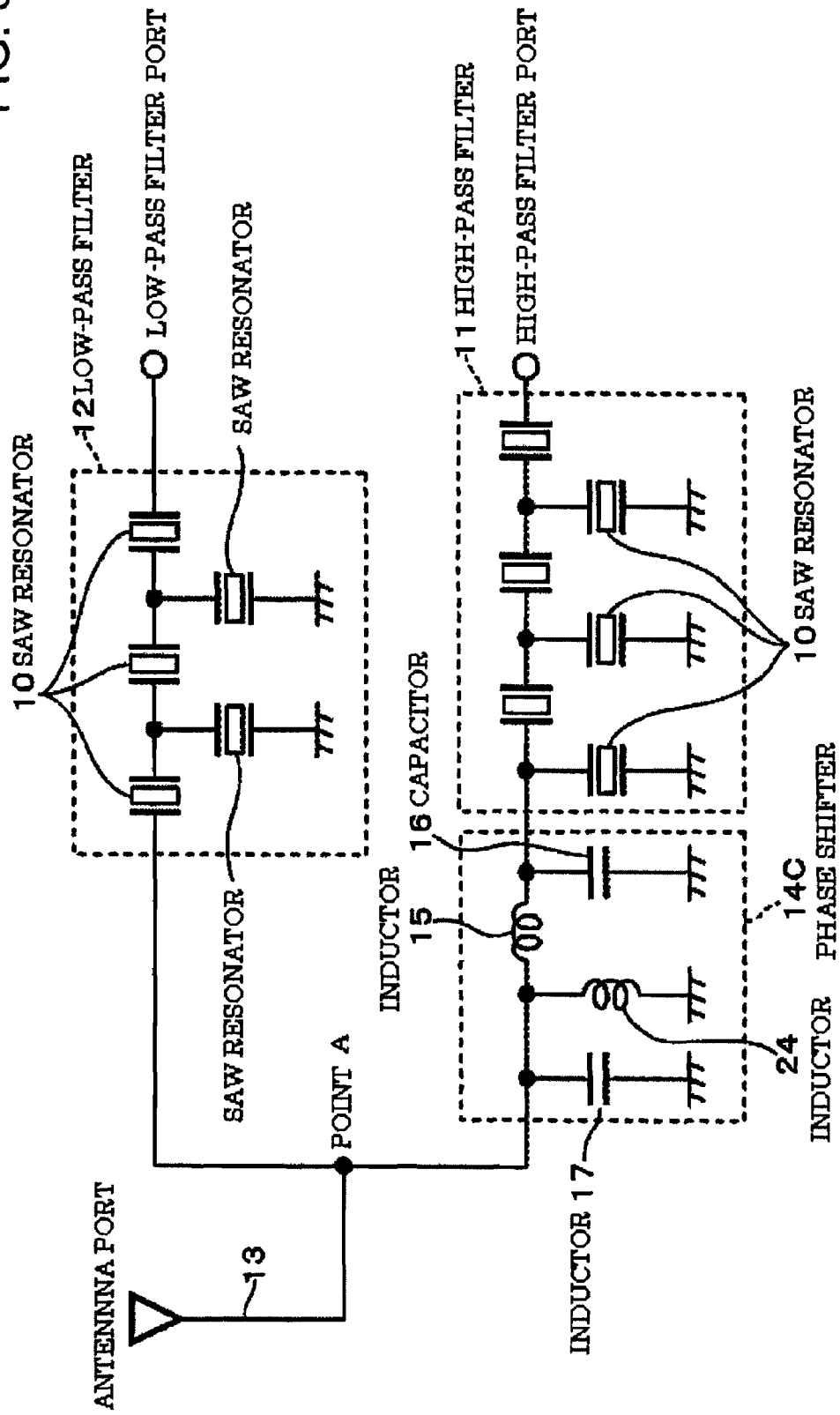
FIG. 9 is a circuit configuration view of an antenna duplexer showing a fourth embodiment of the present invention.
Figure 10:
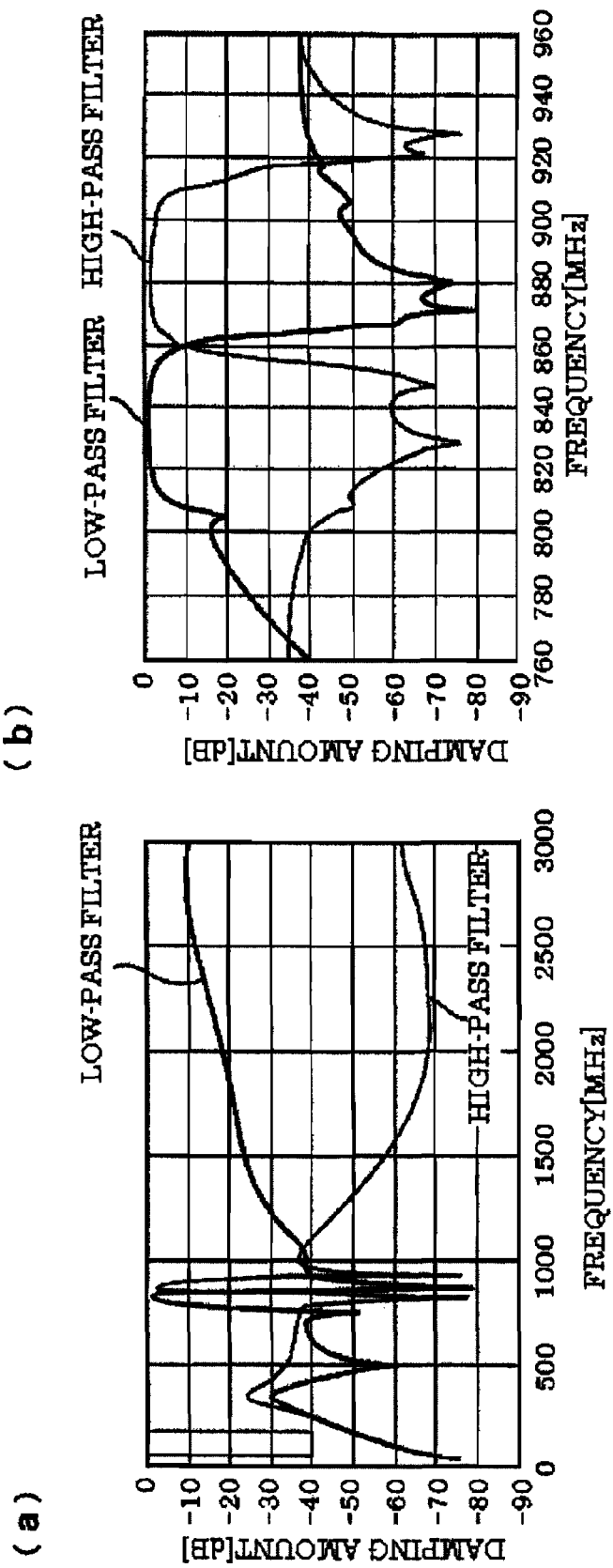
FIGS. 10A and 10B are frequency characteristics of the antenna duplexer according to the fourth embodiment.

A different point of the antenna duplexer shown in FIG. 9 from FIG. 13 is addition of an LC resonance inductor 24. That is, a phase shifter 14 C in a configuration of connecting an LC resonance inductor 24 in parallel to the capacitor 17 is adopted. In this case, a parallel resonance circuit is configured with the capacitor 17 and the inductor 24, and the parallel resonance circuit is configured so as to perform parallel resonance within the pass band of the high band side filter 11 or the low band side filter 12. In this example, it is designed to perform parallel resonance in the vicinity of $f_L$. The frequency characteristic in the case of adopting this phase shifter configuration is improved by 9 dB, compared with the conventional example, because the amount of attenuation at $2 \times f_L$ of the low band side filter is 23 dB, as shown in FIG. 10A and in FIG. 10B which partially enlarges FIG. 10A In addition, the amount of attenuation of the low band side filter and the high band side filter in the frequencies at 100 MHz or below are drastically improved compared with the conventional example. The reason of obtaining such an operation like this is considered to be due to appearance of the function of the band-pass filter by the parallel resonance in addition to the function of the phase shifter.

Figure 11:
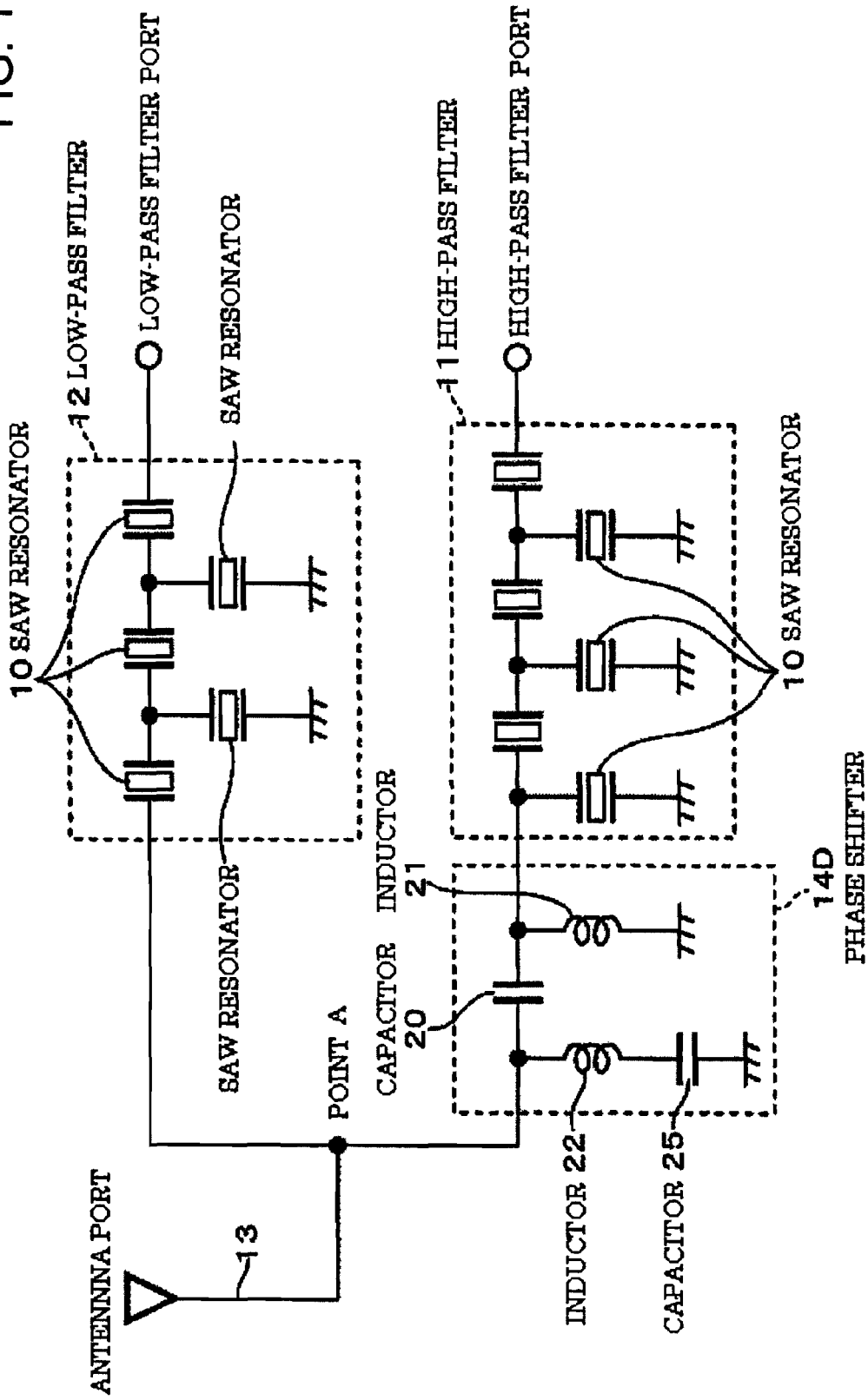
FIG. 11 is a circuit configuration view of an antenna duplexer showing a fifth embodiment of the present invention.
Figure 12:
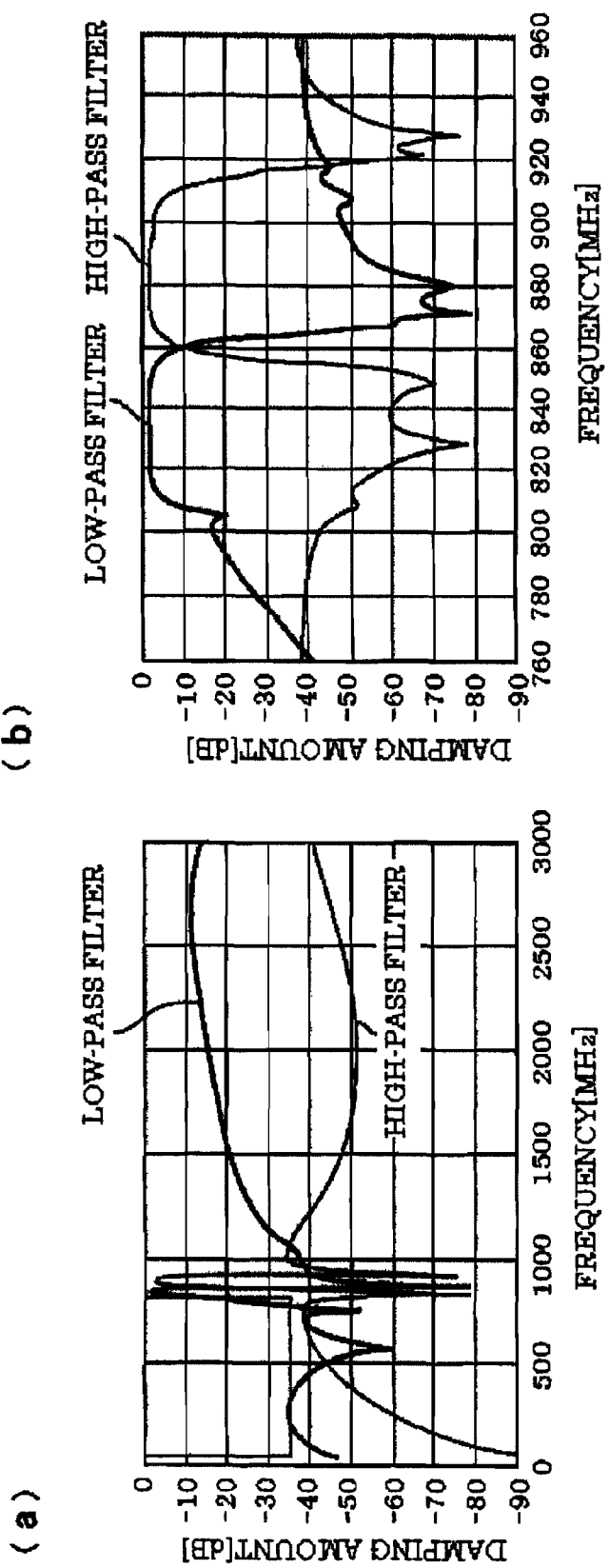
FIGS. 12A and 12B are frequency characteristics of the antenna duplexer according to the fifth embodiment.

A phase shifter 14D used in the antenna duplexer shown in FIG. 11 is configured as a high pass filter disposing a capacitor 20 in series between an input/output signal of a high band side filter 11 and an antenna, and disposing inductors 21 and 22 in parallel between both terminals of the capacitor 20 and the ground. Further, between the inductor 22 on the antenna side and the ground, an LC resonance capacitor 25 series resonating with the inductor 22 in the vicinity of $2 \times f_L$ is provided. The frequency characteristic when forming a phase shifter in this manner, as shown in FIG. 12A and in FIG. 12B which partially enlarges FIG. 12A, the amount of attenuation of the high band side filter in the frequencies at 800 MHz or below is improved. Accordingly, it is superior to the conventional one as a band-pass filter.

As above, in the phase shifter, a series resonance circuit or a parallel resonance circuit composed of a capacitor and an inductor is provided, and the phase matching function of the phase shifter is ensured by adjusting the resonance frequency, so that the attenuation characteristic in an optional frequency band in an out-of-pass band of the high band side filter and the low band side filter can be improved.

Modified Example

In the antenna duplexer shown by the above-described embodiments, it is possible to obtain similar function and effect by modifying the circuit configuration and the circuit component of the phase shifter or the like as below.

Though the phase shifter 14, 14A to 14D are shown for the case of being inserted on the antenna port side of the high band side filter 11, a circuit configuration being directly connected to the antenna port is adopted.

Though the phase shifter is embedded in the antenna duplexer, it can be externally fitted.

Though the circuit configurations of the high band side filter and the low band side filter are all ladder shaped, other shapes can be adopted.

A piezoelectric substrate forming a high band side filter and a low band side filter may be a wafer for a SAW device having a piezoelectric function starting with LiTaO3, LiNbO3 and quartz crystal.

The inductor and the capacitor forming a phase shifter can be formed with a lumped-constant circuit, a printed substrate or a ceramic substrate, or realized by wiring on a SAW chip or may be its composite configuration.

What is claimed is:

1. An antenna duplexer comprising a high band side filter, a low band side filter, an inductor, and a capacitor, and having a phase shifter connected to both of said filters on the antenna port sides to ensure phase matching of both of said filters, wherein said phase shifter comprises a resonance capacitor resonating with said inductor, or a resonance inductor resonating with said capacitor, and an attenuation characteristic is obtained in an out-of-pass band of both of said filters by the resonance; and wherein said phase shifter has a filter configuration including an inductor in series between the high band side filter and the antenna port and further including capacitors respectively between both terminals of the inductor and the ground, and said resonance inductor connected to the capacitor in series on the antenna port side.

2. An antenna duplexer comprising a high band side filter, a low band side filter, an inductor, and a capacitor, and having a phase shifter connected to both of said filters on the antenna port sides to ensure phase matching of both of said filters, wherein said phase shifter comprises a resonance capacitor resonating with said inductor, or a resonance inductor resonating with said capacitor, and an attenuation characteristics is obtained in an out-of-pass band of both of said filters by the resonance; and wherein said phase shifter has a filter configuration including an inductor in series between the high band side filter and the antenna port and further including capacitors respectively between both terminals of the inductor and the ground and a common resonance inductor connected between both of said capacitors and the ground.

3. An antenna duplexer comprising a high band side filter, a low band side filter, an inductor, and a capacitor, and having a phase shifter connected to both of said filters on the antenna port sides to ensure phase matching of both of said filters, wherein said phase shifter comprises a resonance capacitor resonating with said inductor, or a resonance inductor resonating with said capacitor, and an attenuation characteristic is obtained in an out-of-pass band of both of said filters by the resonance; and wherein said phase shifter has a filter configuration including a capacitor in series between the high band side filter and the antenna port and further including inductors respectively between both terminals of the capacitor and the ground and the resonance capacitor connected in series to the inductor on the antenna port side.

4. An antenna duplexer comprising a high band side filter, a low band side filter, an inductor, and a capacitor, and having a phase shifter connected to both filters on the antenna port sides to ensure phase matching of both filters, wherein said phase shifter has a filter configuration by providing a capacitor in services between the high band side filter and the antenna port and including inductors respectively between both terminals of the capacitor and the ground; and a resonance inductor resonating in a pass-band of the high band side filter or the low band side filter is placed connected in series to the capacitor.

5. An antenna duplexer comprising a high band side filter, a low band side filter, an inductor and a capacitor, and having a phase shifter connected to both filters on the antenna port sides to ensure phase matching of both filters;

wherein said phase shifter has a filter configuration including an inductor in series between the high band side filter and the antenna port and further including capacitors respectively between both terminals of the inductor and the ground; and a resonance inductor resonating in a pass-band of the high band side filter or the low band side filter connected in parallel with the capacitor on the antenna port side.

* * * * *